(12) United States Patent
Kim

(10) Patent No.: US 7,723,203 B2
(45) Date of Patent: May 25, 2010

(54) METHOD OF FORMING AN ALIGNMENT KEY HAVING A CAPPING LAYER AND METHOD OF FABRICATING A SEMICONDUCTOR DEVICE USING THE SAME

(75) Inventor: Myoung-Soo Kim, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 465 days.

(21) Appl. No.: 11/524,318

(22) Filed: Sep. 21, 2006

(65) Prior Publication Data

US 2007/0072386 A1   Mar. 29, 2007

(30) Foreign Application Priority Data

Sep. 26, 2005   (KR) .................. 10-2005-0089476

(51) Int. Cl.
*H01L 21/76* (2006.01)

(52) U.S. Cl. .................. 438/401; 438/400; 257/E21.54

(58) Field of Classification Search ............... 438/400, 438/401; 257/797, E21.54, 79, E21.545
See application file for complete search history.

(56) References Cited

U.S. PATENT DOCUMENTS

| | | | |
|---|---|---|---|
| 5,889,335 A | 3/1999 | Kuroi et al. | |
| 6,037,236 A | 3/2000 | Jang | |
| 6,215,197 B1 * | 4/2001 | Iwamatsu | 257/797 |
| 6,706,610 B2 * | 3/2004 | Yoshimura et al. | 438/401 |
| 6,939,777 B2 * | 9/2005 | Ohto et al. | 438/401 |
| 7,129,591 B2 * | 10/2006 | Kim et al. | 257/797 |
| 7,361,963 B2 * | 4/2008 | Ikadai | 257/435 |
| 2007/0037359 A1 * | 2/2007 | Jo | 438/401 |

FOREIGN PATENT DOCUMENTS

| | | |
|---|---|---|
| JP | 11-354400 | 12/1999 |
| KR | 100248155 | 12/1999 |

OTHER PUBLICATIONS

Office Action for corresponding German Application No. 10 2006 046 425.7-33 dated Sep. 12, 2008.
Office Action for corresponding Chinese Application No. 200610143 1876 dated Mar. 20, 2009 and English translation thereof.

* cited by examiner

*Primary Examiner*—Bradley K Smith
(74) *Attorney, Agent, or Firm*—Harness, Dickey & Pierce, P.L.C.

(57) ABSTRACT

A method of forming an alignment key with a capping layer in a semiconductor device without an additional mask formation process, and a method of fabricating a semiconductor device using the same, may be provided. The method of forming an alignment key may include forming an isolation layer confining an active region in a chip region of a semiconductor substrate, and forming an alignment key having a step height difference with respect to the surface of the semiconductor substrate in a scribe lane. An at least one formation layer for forming an element may be formed on the substrate, and patterned, to form an element-forming pattern on the semiconductor substrate in the chip region, and a capping layer capping the alignment key on the semiconductor substrate in the scribe lane.

20 Claims, 12 Drawing Sheets

METHOD OF FORMING AN ALIGNMENT KEY HAVING A CAPPING LAYER AND METHOD OF FABRICATING A SEMICONDUCTOR DEVICE USING THE SAME

PRIORITY STATEMENT

This application claims priority under 35 U.S.C. §119 to Korean Patent Application No. 10-2005-0089476, filed on Sep. 26, 2005, in the Korean Intellectual Property Office (KIPO), the entire contents of which are incorporated herein by reference.

BACKGROUND

1. Field

Example embodiments relate to a method of forming an alignment key having a capping layer without additional processes, and a method of fabricating a semiconductor device including the alignment key having a capping layer.

2. Description of the Related Art

As semiconductor devices become dense and highly integrated, the design rule may be scaled down, and unit elements may become much smaller. Therefore, accurate alignment may be required between a semiconductor substrate and a mask during fabrication. Normally, alignment keys may be formed in a scribe lane of a semiconductor substrate for aligning the semiconductor substrate and the mask. One of the alignment keys may be formed in a scribe lane concurrently with an isolation layer for confining an active region of a chip region through a shallow trench isolation (STI) process and/or the like, and may have a shape which protrudes above the substrate. The alignment key may be used in a gate formation process, an ion implantation process, a silicidation blocking layer (SBL) for a selective silicide formation process, a contact formation process, and/or the like.

Because a power device, for example, an LCD driver IC (LDI) and/or the like, requires lower voltage operation for driving a logic circuit, and higher voltage operation for driving LCD operation, a dual gate oxide layer must be employed. A conventional method of forming the dual gate oxide layer may include forming an isolation layer confining an active region in a chip region of a semiconductor substrate, and concurrently forming a protruding alignment key in a scribe lane. After a first thermal oxide layer is formed on the substrate, the first thermal oxide layer may be wet-etched except for in a higher voltage region of the chip region, thereby forming a first gate oxide layer for a higher voltage operation. A second thermal oxide layer may be formed on the substrate, thereby forming a gate oxide layer for a lower voltage operation in a lower voltage region. A first gate oxide layer may be formed of a thick first thermal oxide layer in the higher voltage region, and a second gate oxide layer may be formed of a thin second thermal oxide layer in the lower voltage region.

However, because the conventional method of forming a dual gate oxide layer may include removing the first thermal oxide layer of the lower voltage region using a wet etch process, in order to remove a portion of the oxide layer of the alignment key, the step height difference between the substrate surface and the alignment key may be reduced. After the alignment key is formed, and when a subsequent wet etch process is performed, the oxide layer of the alignment key may be worn down. If the wearing-down of the oxide layer is substantial, because the step height difference of the alignment key may be removed during repeated wet etch processes, the alignment key may become level with the substrate surface. If the step height difference of the alignment key is removed, alignment may not be made precisely during subsequent processes, and misalignment may occur.

FIGS. 1A-1F illustrate a conventional method of forming an alignment key of a semiconductor device. Referring to FIG. 1A, a pad oxide layer 110 and a hard mask layer 120 may be formed on a semiconductor substrate 100. The hard mask layer 120 and the pad oxide layer 110 may be etched using photolithography and/or the like, to expose a portion of the semiconductor substrate 100 in a chip region 101, and a portion of the semiconductor substrate 100 in a scribe lane 105. The exposed semiconductor substrate 100 may be etched, thereby forming a first trench 131 in the chip region 101, and a second trench 135 in the scribe lane 105.

Referring to FIG. 1B, an oxide layer 140 may be formed on the hard mask layer 120 to fill the first trench 131 and the second trench 135. Referring to FIG. 1C, the oxide layer 140 may be etched using chemical mechanical polishing (CMP) and/or the like to planarize the surface of the substrate. Thus, a first isolation layer 141 may be formed inside the first trench 131, and a second isolation layer 145 may be formed inside the second trench 135. The first isolation layer 141 may confine an active region of the chip region 101.

Referring to FIG. 1D, the hard mask layer 120 and the pad oxide layer 110 may be removed. Referring to FIG. 1E, a photosensitive layer 150 may be deposited on the substrate, and patterned, to expose the second isolation layer 145 of the scribe lane 105. Referring to FIG. 1F, the exposed second isolation layer 145 may be etched using the photosensitive layer 150 as a mask, thereby forming an alignment key 135a. The alignment key 135a may have a recessed structure having a step height difference of H1 with respect to a substrate surface. The second isolation layer 145 may be completely etched, and the alignment key 135a may have a step height difference corresponding to the depth of the second trench 135.

Because the conventional alignment key 135a is recessed to have a step height difference below the substrate surface, the step height difference may be only increased when the oxide layer of the isolation layer 145 may be worn down during a subsequent wet etch process. Therefore, the aforementioned problems of the reduced step height difference of the alignment key 135a may be avoided, but the process may be complicated because an additional mask formation process may be needed to form the recessed alignment key 135a.

SUMMARY

Example embodiments may provide a method of forming an alignment key of a semiconductor device for capping an alignment key without an additional mask formation process. Example embodiments may also provide a method of fabricating a semiconductor device including forming a capping layer of an alignment key in a scribe lane when forming a pattern for forming an element in a chip region.

According to example embodiments, there may be a method of forming an alignment key of a semiconductor device including forming an isolation layer confining an active region in a chip region of a semiconductor substrate and forming an alignment key having a step height difference with respect to the surface of the semiconductor substrate in a scribe lane. An at least one formation layer for an element may be formed on the substrate and may be transformed, to form an element-forming pattern on the semiconductor substrate in the chip region. A capping layer, capping the alignment key, may be formed on the semiconductor substrate in the scribe lane. The alignment key may have a step height difference, with respect to the substrate, of about 50 Å to about 2000 Å.

An at least one formation layer may be an at least one insulation layer or a conductive layer. The at least one formation layer for an element may be transformed by either patterning and/or etching. The at least one formation layer may be an at least one insulating layer and the at least one insulating layer may be a nitride layer. The at least one formation layer may be a conductive layer and the conductive layer may be a polysilicon layer. The at least one formation layer and the capping layer may be composed of a material having an etch selectivity with respect to the alignment key. The alignment key may include an oxide layer and/or the like, and the capping layer may include the at least one formation layer, or may include a stack layer including the at least one formation layer. The at least one formation layer may include a material for forming a gate electrode or gate insulating layer of the semiconductor device, or a material for forming a capacitor lower electrode of the semiconductor device, or a material for forming a capacitor dielectric layer of the semiconductor device, or a stack structure including a material for forming a capacitor lower electrode and/or a material for forming a dielectric layer of the semiconductor device. The gate electrode may include a gate oxide layer and/or a gate insulating layer.

Forming the isolation layer and the alignment key may include forming a pad oxide layer and a hard mask layer on the substrate such that portions where the isolation layer and the alignment key are formed on the substrate are exposed. The exposed portions of the substrate may be etched to form a first trench in the chip region and a second trench in the scribe lane. The isolation layer may be formed in the first trench and the alignment key may be formed in the second trench. The hard mask layer may have a thickness of about 500 Å to about 3000 Å. The method of forming an alignment key of a semiconductor device may further include forming a capacitor dielectric layer on the capacitor lower electrode and/or forming a capacitor upper electrode on the capacitor dielectric layer.

BRIEF DESCRIPTION OF THE DRAWINGS

The above and other features and advantages of example embodiments will become more apparent by describing in detail example embodiments thereof with reference to the attached drawings in which.

DETAILED DESCRIPTION OF EXAMPLE EMBODIMENTS

Various example embodiments will now be described more fully with reference to the accompanying drawings, in which some example embodiments are shown. Example embodiments may, however, be embodied in many different forms, and should not be construed as being limited to the embodiments set forth herein. Rather, these embodiments are provided so that this disclosure will be thorough and complete, and will fully convey the scope of example embodiments to those skilled in the art. Like numbers refer to like elements throughout the specification.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90° or at other orientations) and the spatially relative descriptors used herein interpreted accordingly.

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1A:
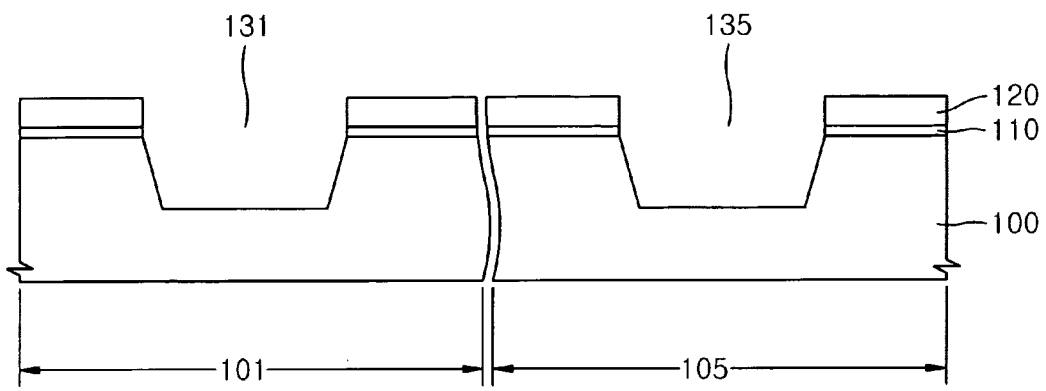
FIGS. 1A-1F illustrate a method of forming an alignment key of a conventional semiconductor device.
Figure 1B:
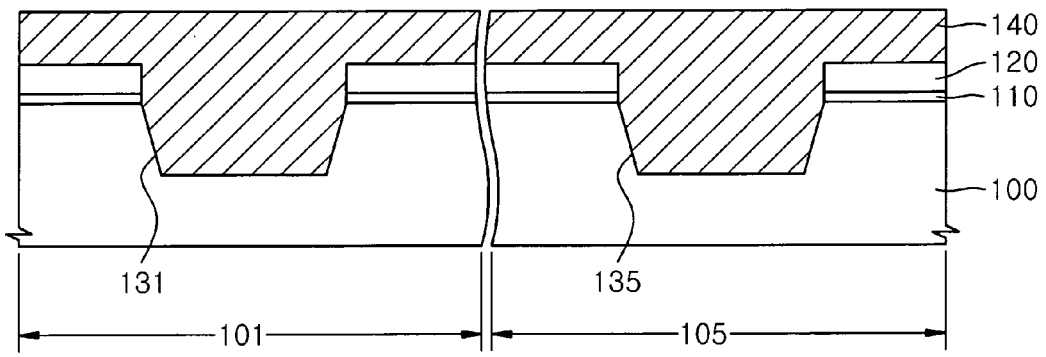
Figure 1C:
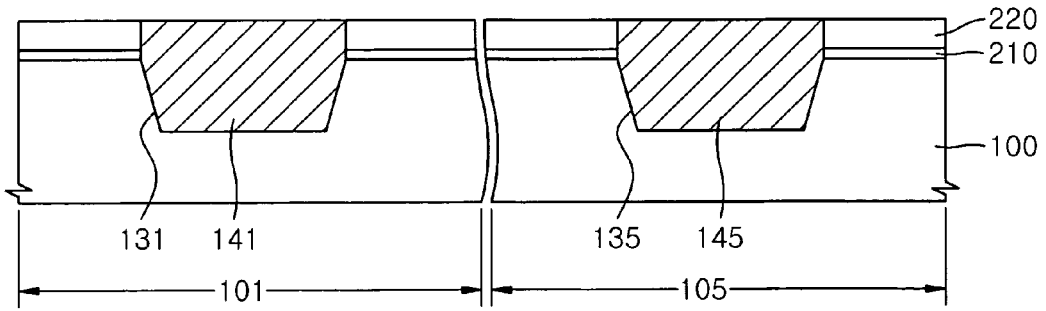
Figure 1D:
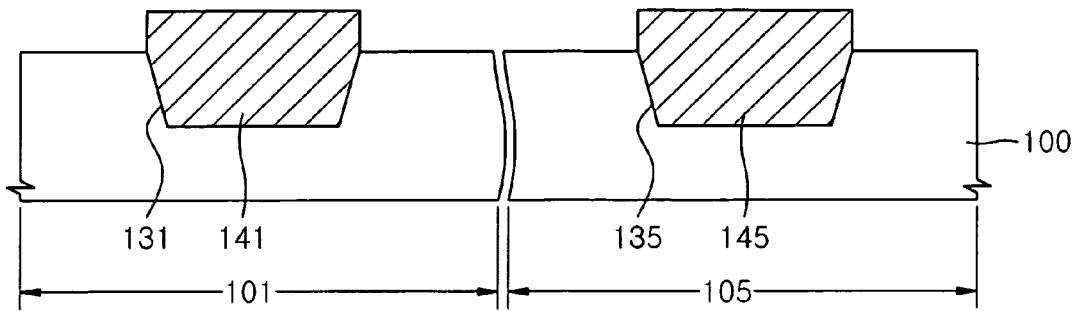
Figure 1E:
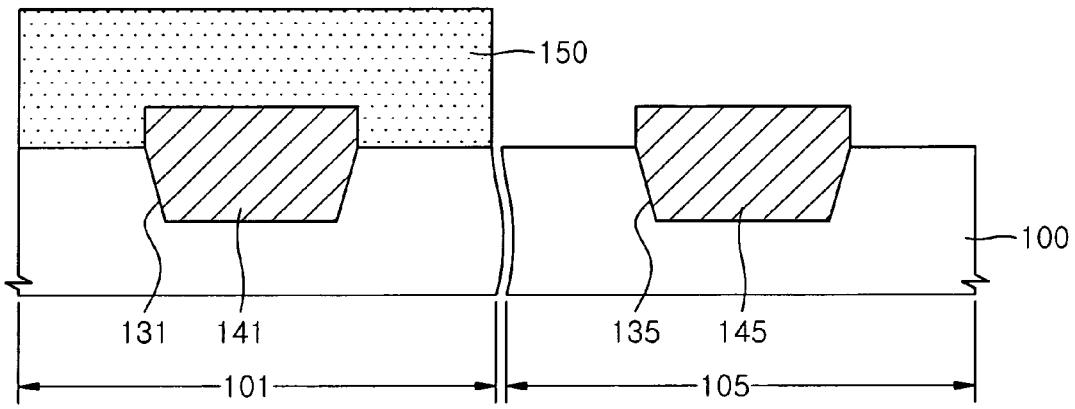
Figure 1F:
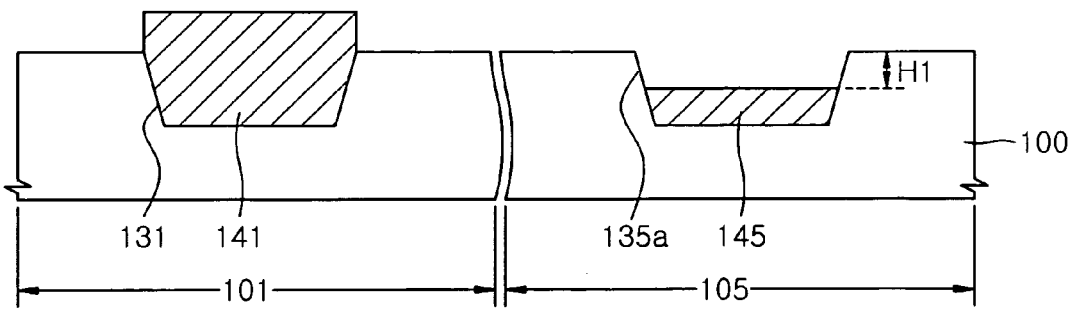
Figure 2A:
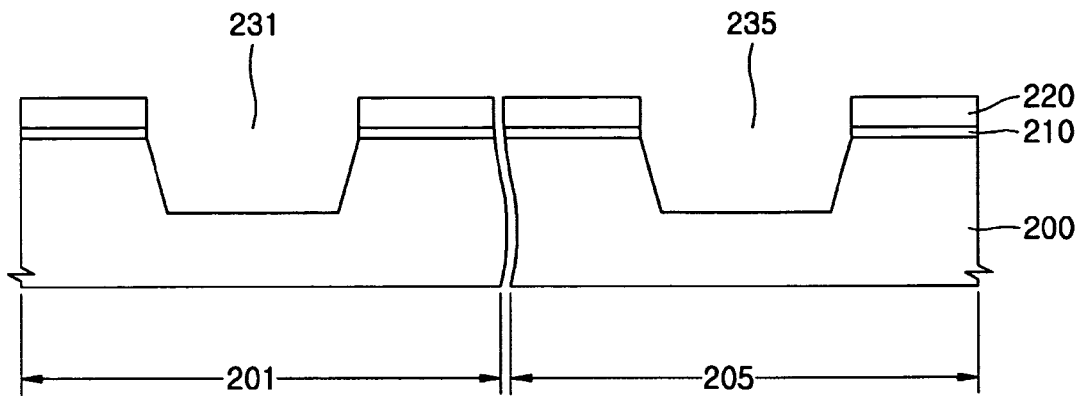
FIGS. 2A-2F illustrate a method of forming an alignment key of a semiconductor device according to example embodiments.

FIGS. 2A-2F illustrate a method of forming an alignment key of a semiconductor device according to example embodiments. Referring to FIG. 2A, a pad oxide layer 210 and a hard mask layer 220 may be formed on a semiconductor substrate 200. The hard mask layer 220 may include a nitride layer and/or the like, and the thickness of the hard mask layer 220 may be determined depending on a step height difference of an alignment key to be formed in a subsequent process. The hard mask layer 220 and the pad oxide layer 210 may be etched to expose a portion of the semiconductor substrate 200. A portion of a chip region 201 in the semiconductor substrate 200, in which unit elements will be formed, and a portion of a scribe lane 205, separating the chip region 201, may be exposed. The exposed portion of the semiconductor substrate 200 may be etched, thereby forming a first trench 231 in the chip region 201, and forming a second trench 235 in scribe lane 205. The first trench 231 may form an isolation layer confining an active region of the chip region 201, and the second trench 235 may form an alignment key in the scribe lane 205.

Figure 2B:
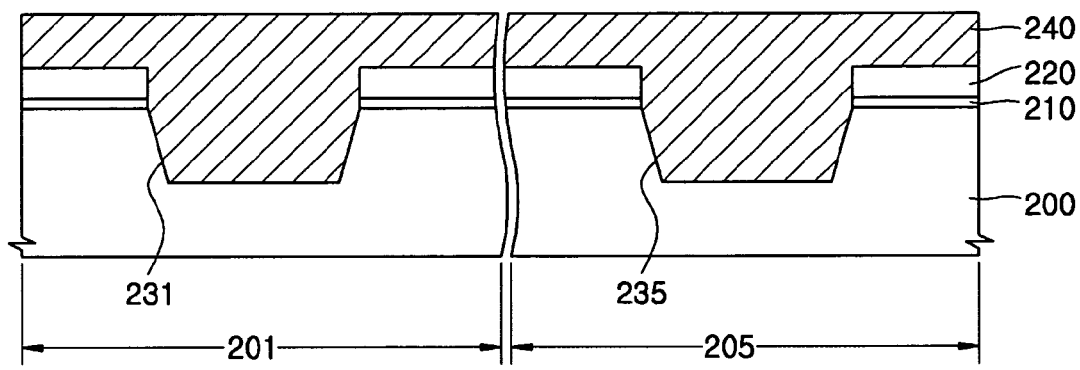

Referring to FIG. 2B, an insulating layer 240 may be formed on the hard mask layer 220 to fill the first trench 201 and the second trench 205. The insulating layer 240 may be formed of a USG, O3-TEOS USG, and/or a high density plasma (HDP) oxide layer, having improved gap filling characteristics, to allow filling of the first and second trenches 231 and 235.

Figure 2C:
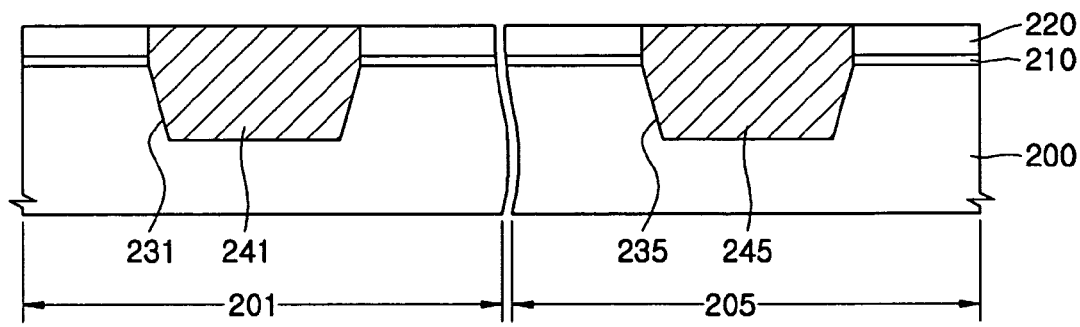

Referring to FIG. 2C, the insulating layer 240 may be etched by chemical mechanical polishing (CMP) and/or the like, to planarize the substrate surface. Thus, an isolation layer 241 may be formed inside the first trench 231, and an alignment key 245 may be formed inside the second trench 235. Before the first and second trenches 231 and 235 may be filled by the insulating layer 240, a liner formed of a nitride layer, a thermal oxide layer as an oxide buffer layer for alleviating stress between the liner and the substrate, and/or a middle temperature oxide (MTO) layer, may be formed inside first and second trenches 231 and 235.

Figure 2D:
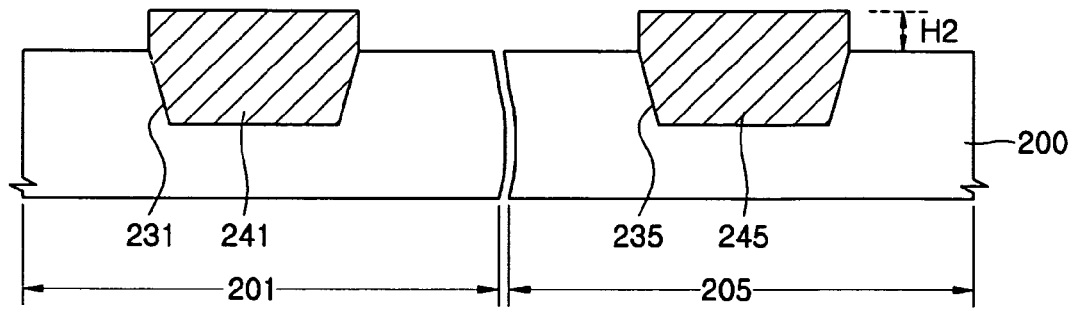

Referring to FIG. 2D, the hard mask layer 220 and the pad oxide layer 210 may be removed using a phosphoric acid stripping process and/or the like. An isolation layer 241 may be formed in the chip region 201 of the substrate 200 with a step height difference between the substrate surface and the isolation layer 241, and a protruding alignment key 245 may be formed in the scribe lane 205 with a step height difference H2 between the substrate surface and the alignment key 245. The step height difference H2 of the alignment key 245 may be determined by the thickness of the hard mask layer 220, the CMP process, and/or the phosphoric acid stripping process of a hard mask. The alignment key 245 may have a step height difference of about 50 Å to about 2000 Å. The hard mask layer 220 may have a thickness of about 500 Å to about 3000 Å.

Figure 2E:
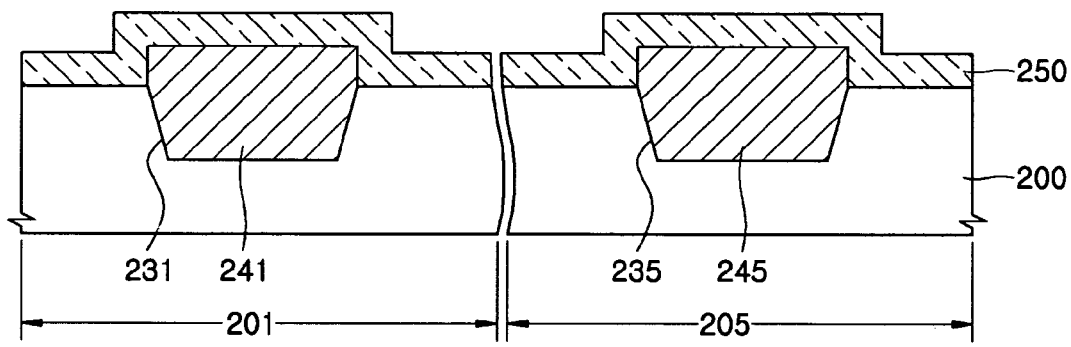

Referring to FIG. 2E, a layer 250 for forming an element may be formed on the substrate 200 having the isolation layer 241 and the alignment key 245. The at least one formation layer 250 may be composed of a material having an etch selectivity with respect to the isolation layer 241 and the alignment key 245, for example, a wet etch selectivity and/or the like.

The at least one formation layer 250 may include a conductive layer or an insulating layer. The conductive layer may be a polysilicon layer and/or the like, and the insulating layer may be a nitride layer and/or the like. The at least one formation layer 250 may be used to form a unit element (not shown) in the chip region 201, and may use a polysilicon layer for forming a gate and/or a lower electrode of a capacitor, and/or a nitride layer for forming an ONO dielectric layer of a capacitor. Further, when a gate insulating layer uses a nitride layer, the gate insulating layer may be used for the at least one formation layer 250. In addition, the at least one formation layer 250 may employ various layers for forming a unit element of the chip region 201.

Figure 2F:
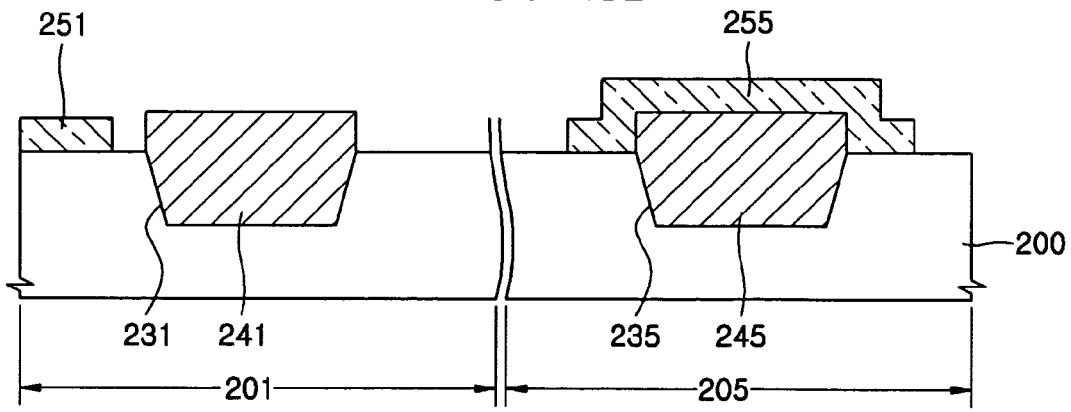

Referring to FIG. 2F, the at least one formation layer 250 may be patterned, thereby forming a pattern 251 for forming the unit element in the chip region 201, and forming a capping layer 255 in the scribe lane 205 to cover the alignment key 245. Because the capping layer 255, which may be composed of a material having a wet etch selectivity with respect to the alignment key 245, may be structured to cap the alignment key 245, the capping layer 255 retards, or prevents, an oxide layer of the alignment key 245 from wearing down during a subsequent wet etch process for forming the unit element. Thus, the step height difference H2, between an alignment key 245 and the substrate, may be maintained by the capping layer 255.

According to example embodiments, the method of forming an alignment key may maintain the step height difference of the alignment key even without an additional mask forming process, because the capping layer 255, capping the alignment key 245 formed in the scribe lane 205, may be formed concurrently with forming the element-forming pattern 251 to form the unit element of the chip region 201.

FIGS. 3A-3F illustrate a method of fabricating a semiconductor device according to example embodiments. In example embodiments, when a gate and a capacitor lower electrode may be formed in the chip region using a polysilicon layer as an at least one formation layer, a capping layer of an alignment key may be formed concurrently in the scribe lane.

Figure 3A:
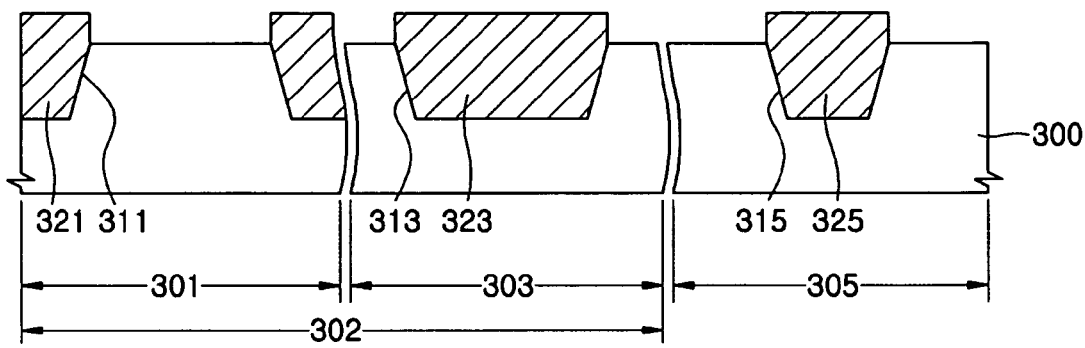
FIGS. 3A-3F illustrate a method of fabricating a semiconductor device according to example embodiments.

Referring to FIG. 3A, the semiconductor substrate 300 may include a chip region 302 where unit elements may be formed, and a scribe lane 305 separating the chip region 302. A MOS transistor may be formed in a first region 301 of the chip region 302, and a capacitor may be formed in a second region 303 of the chip region 302. The substrate 300 may be etched by the same process as that illustrated in FIGS. 2A-2D, thereby forming a first trench 311 in the first region 301 of the chip region 302, a second trench 313 in the second region 303 of the chip region 302, and a third trench 315 in the scribe lane 305. The first, second and third trenches 311, 313, and 315 may be filled with an insulating layer, for example, a USG, O3-TEOS USG, and/or a HDP oxide layer, and a CMP process and/or the like may be performed, thereby forming a first isolation layer 321 and a second isolation layer 323 in the first trench 311 and the second trench 313, respectively. Concurrently, a protruding alignment key 325 may be formed in the third trench 315.

Figure 3B:
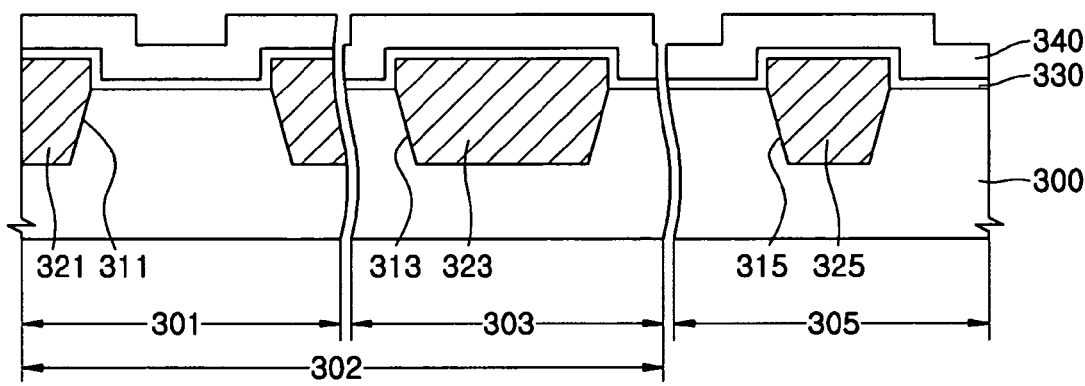
Figure 3C:
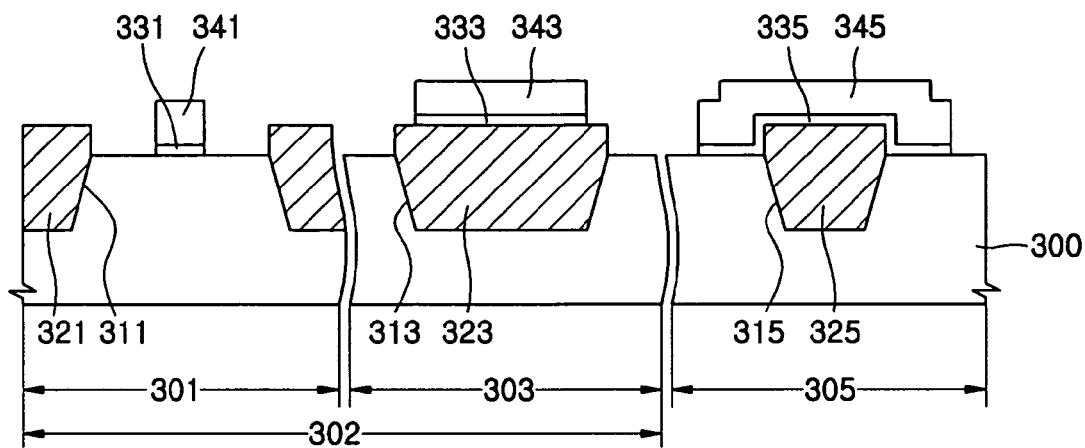

Referring to FIG. 3B, a first insulating layer 330 and a polysilicon layer 340 may be formed on the substrate having the first and second isolation layers 321 and 323, and the alignment key 325 formed thereon. The polysilicon layer 340 may be formed by depositing a polysilicon layer doped with p-type and/or n-type impurities, or by depositing an undoped polysilicon layer and doping p-type and/or n-type impurities through an ion implantation process. Referring to FIG. 3C, the polysilicon layer 340 and the first insulating layer 330 may be etched, thereby forming a gate 341 having a gate oxide layer 331 in the first region 301. A capacitor lower electrode 343 may be formed in the second region 303, and a capping layer 345 may be formed of a single polysilicon layer in the scribe lane 305. First insulating layer patterns 333 and 335 may be left below the capacitor lower electrode 343 and the capping layer 345, respectively. Thus, when the gate electrode 341 and the capacitor lower electrode 343 may be formed in the chip region 302, a capping layer 345 for the alignment key 325 may be concurrently formed in the scribe lane 305.

Example embodiments in FIG. 3 illustrates the gate electrode 341 and the capacitor lower electrode 343 formed concurrently in the chip region 302, but alternatively, a polysilicon layer may be deposited and patterned, thereby forming a gate 341 in the first region 301 of the chip region 302, and another polysilicon layer may be deposited and patterned, thereby forming a capacitor lower electrode 343 in the second region 303 of the chip region 302. Or, a polysilicon layer may be deposited and patterned in the second region 303, so as to form a capacitor lower electrode 343, and a polysilicon layer may be deposited and patterned in the first region 301, so as to form a gate. The capping layer 345 may be formed during the process of forming the gate and/or the process of forming the capacitor lower electrode, and may be formed during the first of these processes to be performed.

Example embodiments also may illustrate one transistor formed in the chip region 202, but a higher voltage transistor, a middle voltage transistor, and/or a lower voltage transistor may be formed. After an isolation layer may be formed in the chip region, and an alignment key may be formed in the scribe lane, a gate insulating layer of a thick higher voltage transistor, a gate insulating layer of a middle voltage transistor, and/or a gate insulating layer of a thin lower voltage transistor may be formed in the chip region. When the gate insulating layer is formed of a nitride layer, and the gate insulating layer and the capping layer may be formed concurrently, the capping layer of the alignment key may be formed at the same time as whichever gate oxide layer may be formed first out of the higher voltage, the middle voltage, and/or the lower voltage transistors.

Figure 3D:
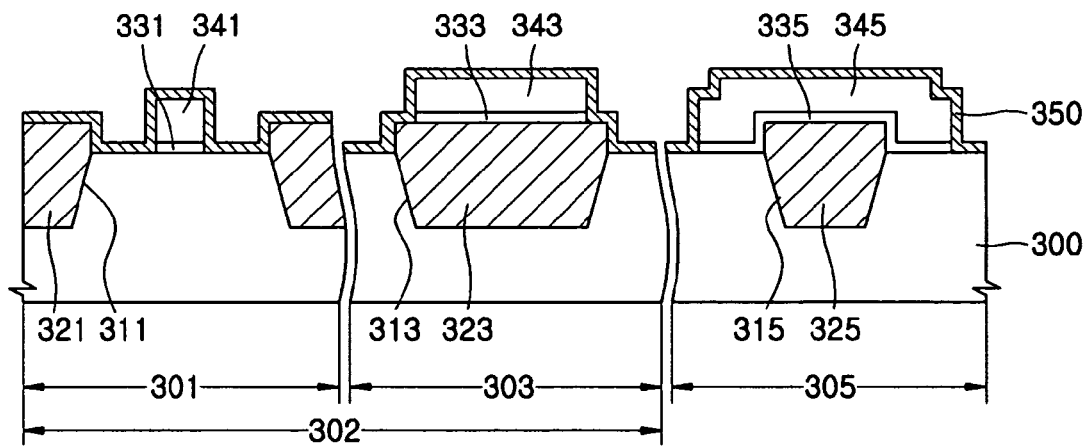
Figure 3E:
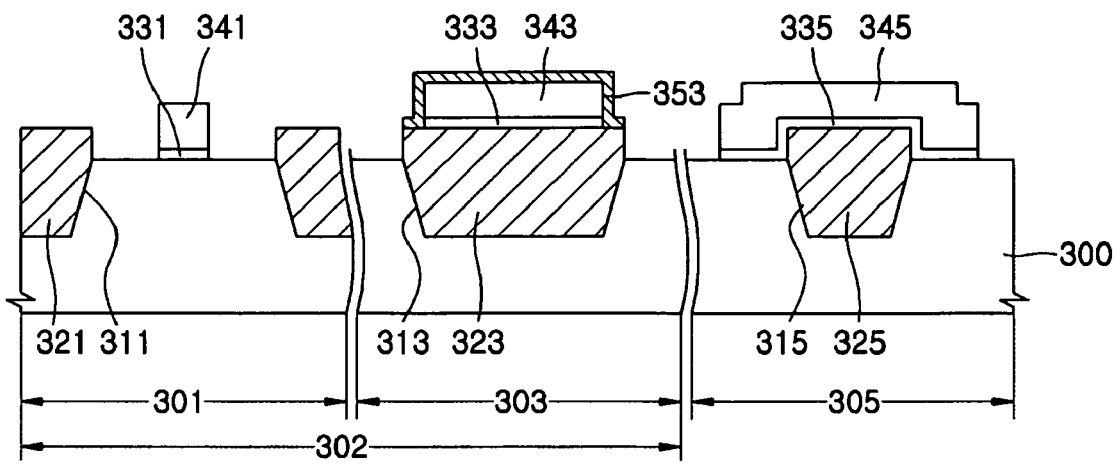
Figure 3F:
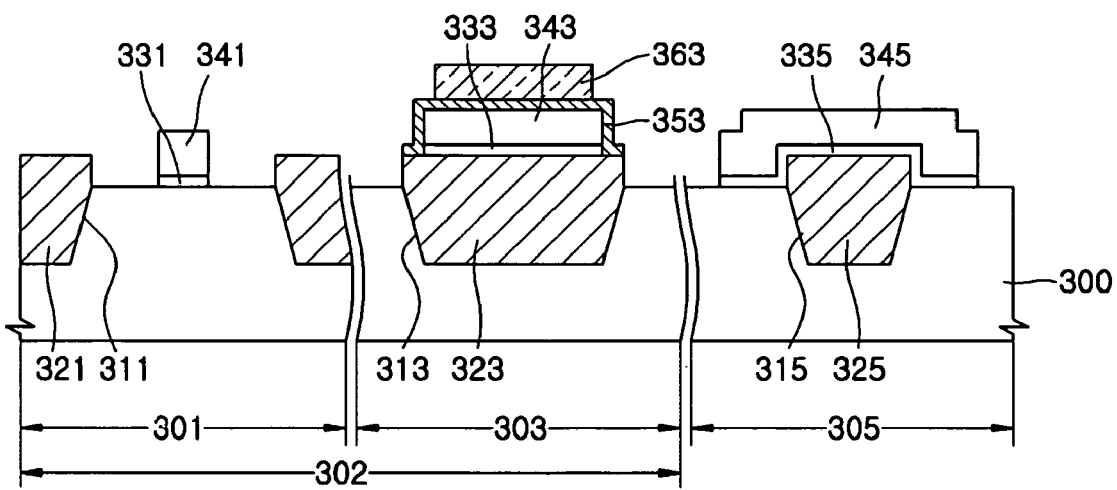

Referring to FIG. 3D, a second insulating layer 350 may be deposited on the substrate. The second insulating layer 350 may include at least one of an oxide-nitride-oxide (ONO) layer, a tantalum oxide layer, a zirconium oxide layer, a hafnium oxide layer, a BST oxide layer, a PZT and/or a SBT oxide layer and/or the like. Referring to FIG. 3E, the second insulating layer 350 may be patterned, thereby forming a capacitor dielectric layer 353 on the capacitor lower electrode 343. Referring to FIG. 3F, a polysilicon layer may be deposited on the substrate and patterned, thereby forming a capacitor upper electrode 363 on the capacitor dielectric layer 353. When the capacitor lower electrode 343 is formed first before forming the gate 341, the gate 341 and the capacitor upper electrode 363 may be formed concurrently.

FIGS. 4A-4D illustrate a method of fabricating a semiconductor device according to example embodiments. In FIGS. 4A-4D, when a gate, a capacitor lower electrode, and a capacitor dielectric layer may be formed in a chip region using a polysilicon layer and/or an ONO layer as an at least one formation layer, a capping layer of an alignment key may be formed concurrently in a scribe lane.

Figure 4A:
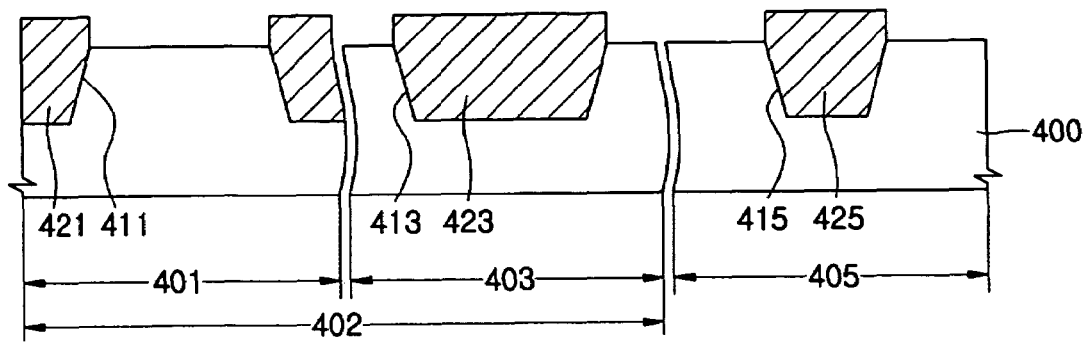
FIGS. 4A-4D illustrate a method of fabricating a semiconductor device according to example embodiments.

Referring to FIG. 4A, a semiconductor substrate 400 may include a chip region 402 where a unit element will be formed, and a scribe lane 405 separating the chip region 402. A MOS transistor may be formed in a first region 401 of the chip region 402, and a capacitor may be formed in a second region 403 of the chip region 402. Like example embodiments illustrated in FIG. 3A, a first trench 411 and a second trench 413 may be respectively formed in the first region 401 and the second region 403 of the chip region 402, and a third trench 415 may be formed in the scribe lane 405. After the first, second and third trenches 411, 413, and 415 may be filled with oxide layers, for example, USG, O3-TEOS USG, and/or a HDP oxide layer, a CMP process and/or the like may be performed, thereby forming a first isolation layer 421 and a second isolation layer 423 in the first trench 411, and the second trench 413, respectively. Concurrently, a protruding alignment key 425 may be formed in the third trench 415.

Figure 4B:
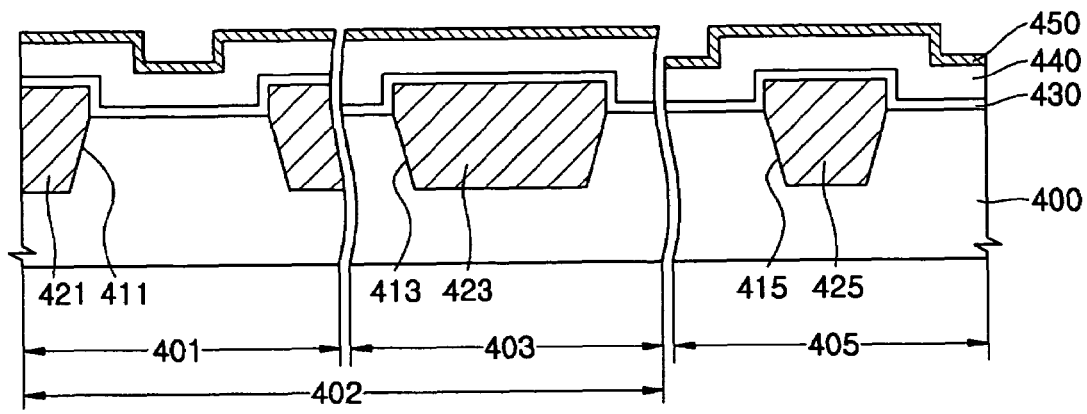

Referring to FIG. 4B, a first insulating layer 430, a polysilicon layer 440, and a second insulating layer 450 may be sequentially formed on the substrate having the first and second isolation layers 421 and 423, and the alignment key 425. The polysilicon layer 440 may be formed by depositing a polysilicon layer doped with p-type and/or n-type impurities, or by depositing an undoped polysilicon layer and doping p-type and/or n-type impurities, using an ion implantation process. The second insulating layer 450 may include at least a nitride layer, for example, an oxide-nitride-oxide (ONO) layer and/or an NO layer.

Figure 4C:
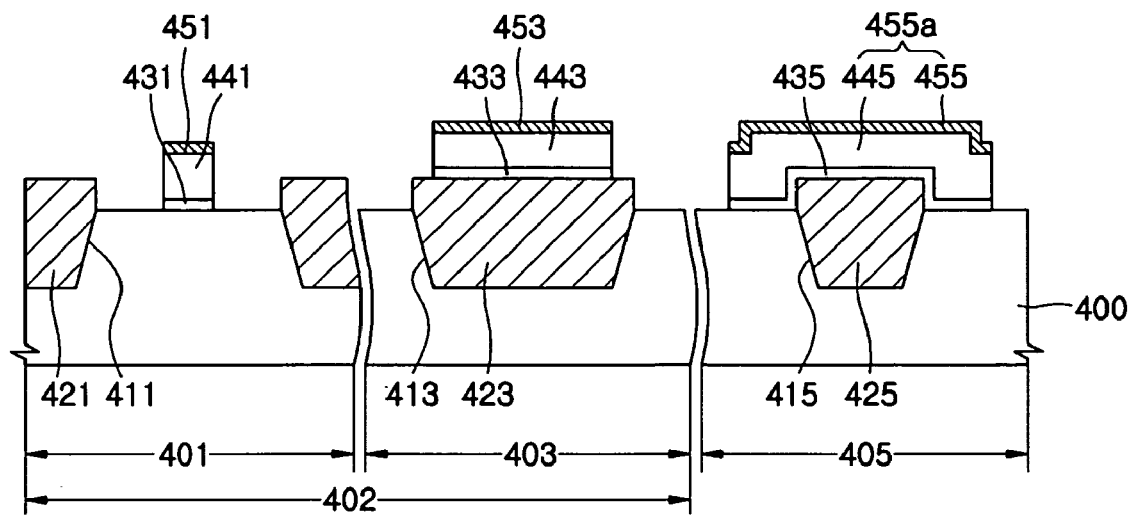

Referring to FIG. 4C, the polysilicon layer 440 and the first and second insulating layers 430 and 450 may be etched, thereby forming a gate 441 having a gate insulating layer 431 in the first region 401. A second insulating layer pattern 451 may be left on the gate 441. A capacitor lower electrode 443 and a capacitor dielectric layer 453 may be formed in the second region 403, and a capping layer 445a may be formed in the scribe lane 405. The capping layer 455a may have a stack structure including a polysilicon layer pattern 445 and a second insulating layer pattern 455. First insulating layer patterns 433 and 435 may be left below the capacitor lower electrode 443 and the capping layer 445a, respectively. Thus, when the gate electrode 441 and the capacitor lower electrode 443 may be formed in the chip region 402, a capping layer 445a for the alignment key 425 may be formed concurrently in the scribe lane 405.

Example embodiments of FIG. 4 illustrate the gate electrode 441 and the capacitor lower electrode 443 that may be formed concurrently in the chip region 402, but alternatively, a first insulating layer and a polysilicon layer may be deposited and patterned, to form a gate 441 in the first region 401 of the chip region 402, and another polysilicon layer and a second insulating layer may be deposited and patterned, to form a capacitor lower electrode 443 and a capacitor dielectric layer 453 in the second region 403 of the chip region 402. Alternatively, after the capacitor lower electrode 443 and the capacitor dielectric layer 453 may be formed in the second region 403, the gate 441 may be formed in the first region 401. The capping layer 445a may be formed when the gate and/or the capacitor lower electrode, and the capacitor dielectric layer are formed, and may be formed in a preceding process of forming the gate and/or the capacitor lower electrode, and the capacitor dielectric layer.

Figure 4D:
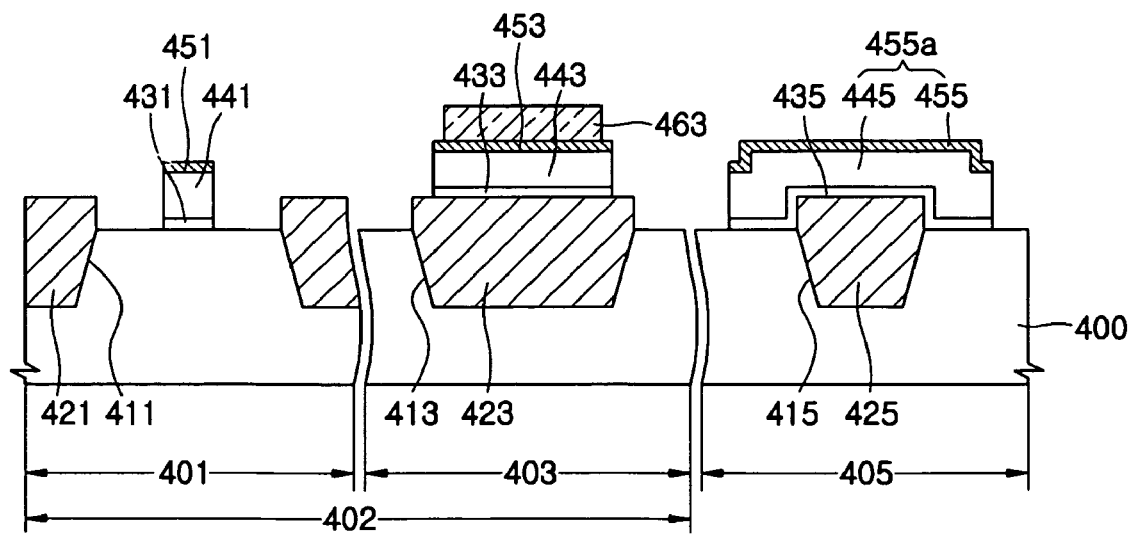

Referring to FIG. 4D, after a polysilicon layer is deposited on the substrate, and patterned, a capacitor upper electrode 463 may be formed on the capacitor dielectric layer 453.

When the capacitor lower electrode 443 is formed before the gate 441, the gate 441 and the capacitor upper electrode 463 may be formed concurrently. In example embodiments illustrated in FIGS. 4A to 4D, higher voltage, middle voltage, and/or lower voltage transistors in the chip region 402 may be formed like example embodiments illustrated in FIGS. 3A to 3F.

FIGS. 5A-5F illustrate a method of fabricating a semiconductor device according to example embodiments. In FIG. 5, when a capacitor dielectric layer is formed in a chip region using a nitride layer as a device formation layer, a capping layer of an alignment key may be concurrently formed in a scribe lane.

Figure 5A:
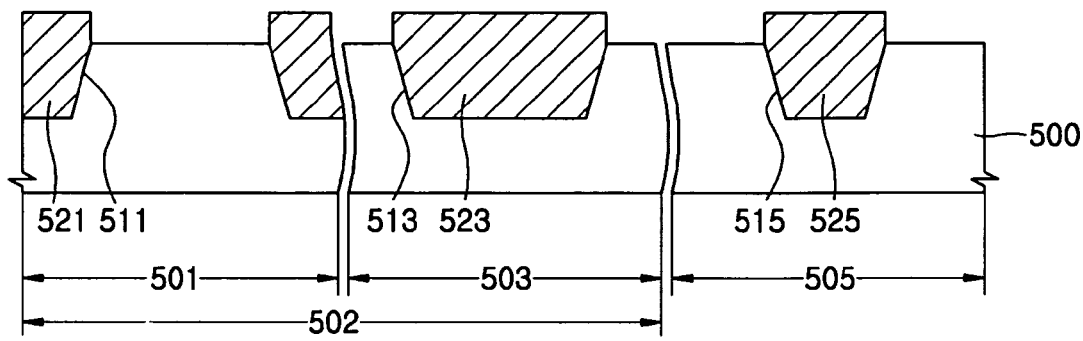
FIGS. 5A-5F illustrate a method of fabricating a semiconductor device according to example embodiments.

Referring to FIG. 5A, a semiconductor substrate 500 may include a chip region 502 where a unit element will be formed, and a scribe lane 505 separating the chip region 502. A MOS transistor may be formed in a first region 501 of the chip region 502, and a capacitor may be formed in a second region 503 of the chip region 502. Like example embodiments in FIG. 3A, the substrate 500 may be etched, thereby respectively forming a first trench 511 and a second trench 513 in the first region 501 and the second region 503 of the chip region 502, and forming a third trench 515 in the scribe lane 505. After the first, second and third trenches 511, 513, and 515 are filled with an insulating layer, for example, an oxide layer, for example, USG, O3-TEOS USG, and/or a HDP oxide layer, a CMP process and/or the like may be performed, thereby forming a first isolation layer 521 and a second isolation layer 523 in the first trench 511 and the second trench 513, respectively. Concurrently, a protruding alignment key 525 may be formed in the third trench 515.

Figure 5B:
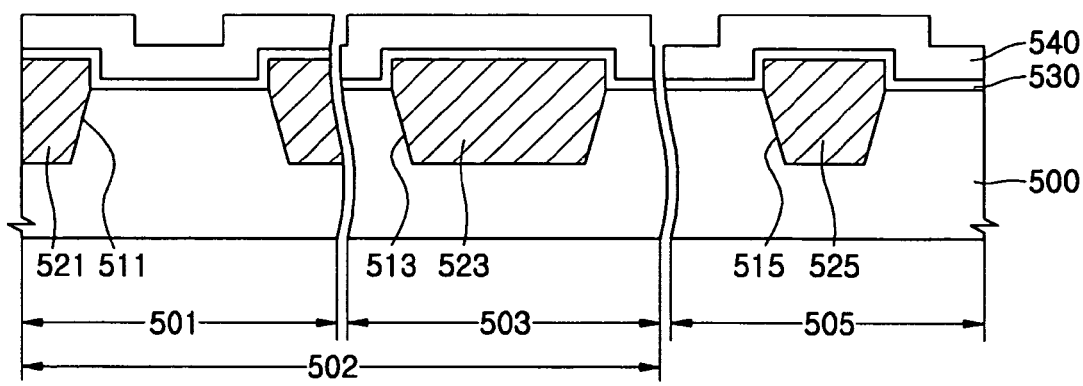
Figure 5C:
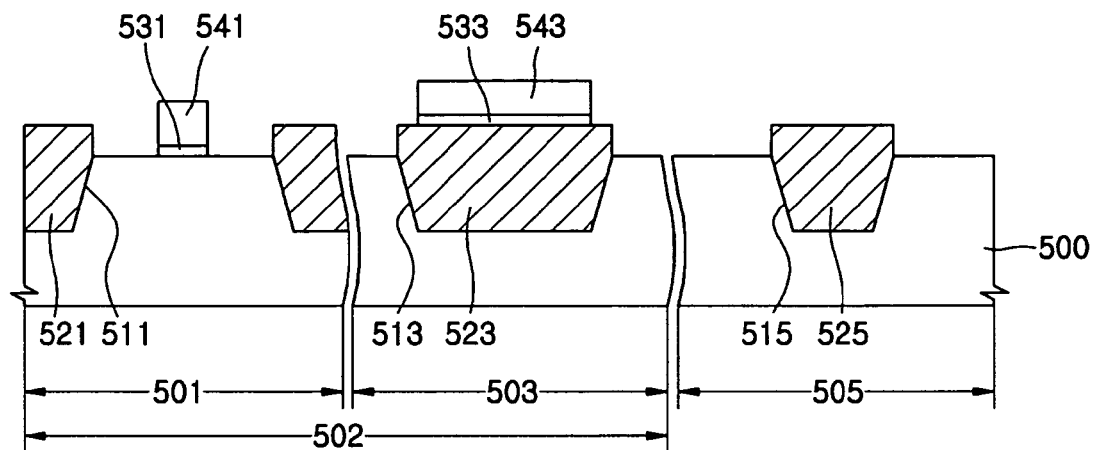

Referring to FIG. 5B, a first insulating layer 530 and a polysilicon layer 540 may be formed on the substrate having the first and second isolation layers 521 and 523 and the alignment key 525. The polysilicon layer 540 may be formed by depositing a polysilicon layer doped with p-type and/or n-type impurities, or by depositing an undoped polysilicon layer and doping p-type and/or n-type impurities, using an ion implantation process. Referring to FIG. 5C, the polysilicon layer 540 and the insulating layer 530 may be etched, thereby forming a gate 541 having a gate oxide layer 531 in the first region 501. A capacitor lower electrode 543 may be formed in the second region 503. A first insulating layer pattern 533 may be left below the capacitor lower electrode 543.

Example embodiments of FIG. 5 illustrate the gate electrode 541 and the capacitor lower electrode 543 formed concurrently in the chip region 502, but the gate 541 may be formed in the first region 501 of the chip region 502 by depositing and patterning a gate oxide layer and a polysilicon layer, and the capacitor lower electrode 543 may be formed in the second region 503 of the chip region 502 by depositing and patterning another polysilicon layer. Alternatively, after the capacitor lower electrode 543 is formed in the second region 503, the gate 541 may be formed in the first region 501.

Figure 5D:
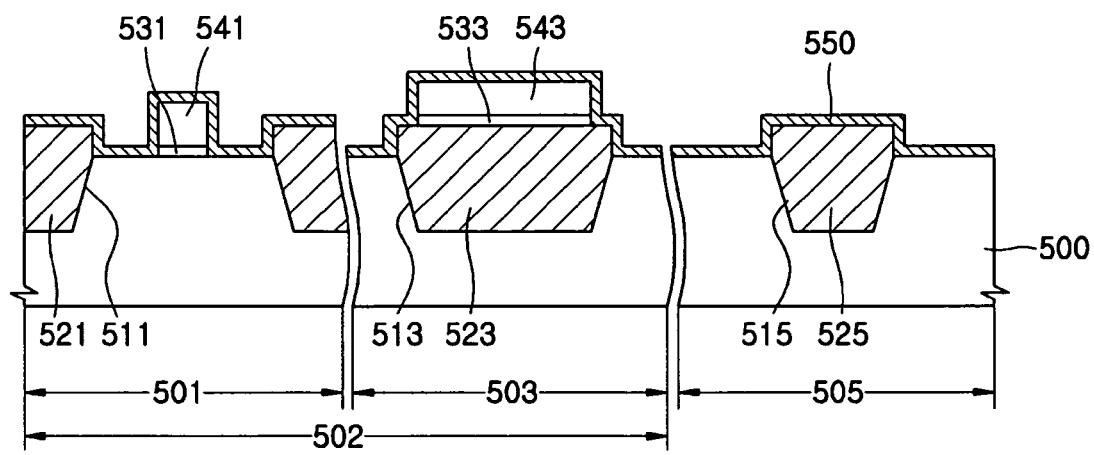
Figure 5E:
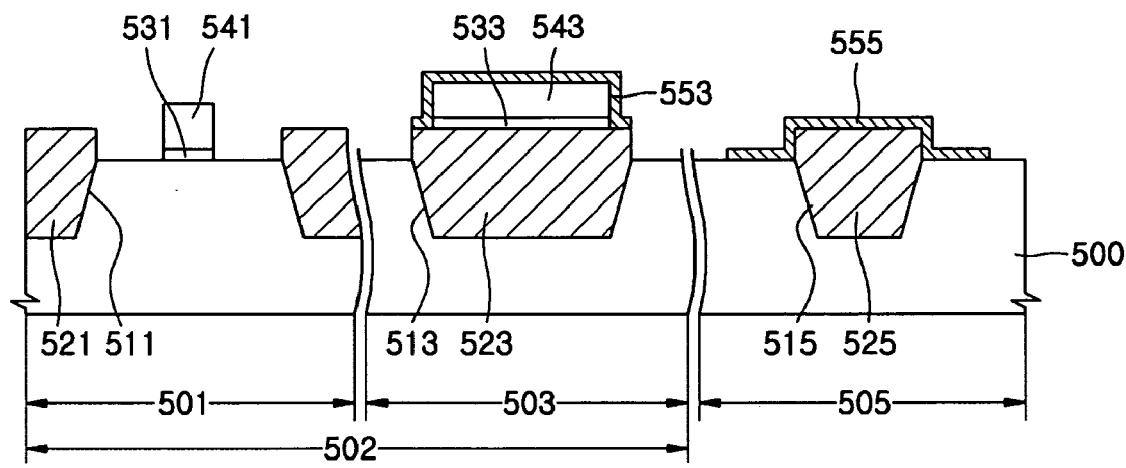
Figure 5F:
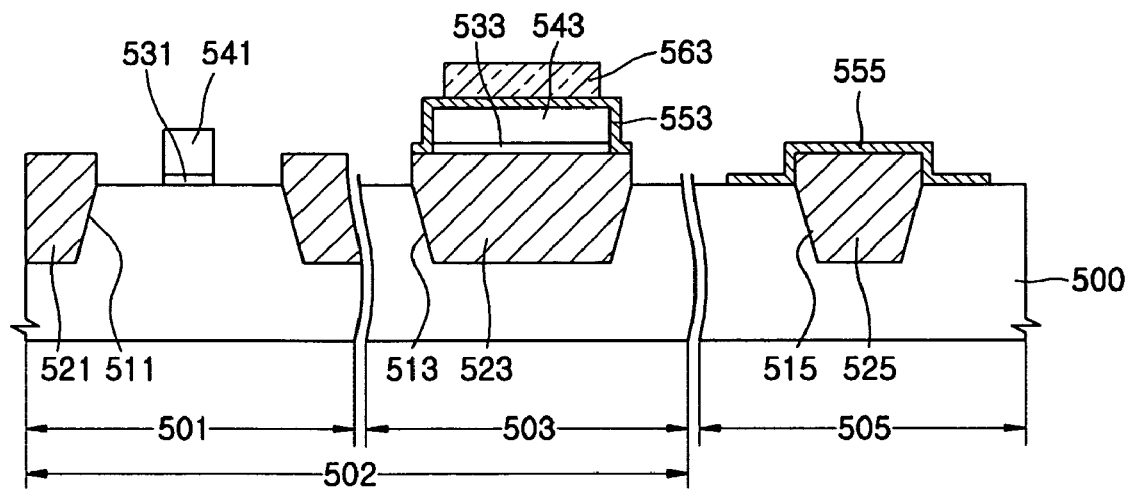

Referring to FIG. 5D, a second insulating layer 550 may be deposited on the substrate. The insulating layer 550 may include at least a nitride layer, for example, an ONO layer and/or an NO layer. Referring to FIG. 5E, the second insulating layer 550 may be patterned, thereby forming a capacitor dielectric layer 553 on the capacitor lower electrode 543. A capping layer 555 for an alignment key 525 may be formed concurrently in the scribe lane 505. Thus, a capping layer 555, including at least a nitride layer, may be formed. Referring to FIG. 5F, a polysilicon layer may be deposited on the substrate, and patterned, thereby forming a capacitor upper electrode 563 on the capacitor dielectric layer 553. In example embodiments illustrated in FIGS. 5A to 5F, higher voltage, middle voltage, and/or lower voltage transistors may be formed in the chip region like example embodiments illustrated in FIGS. 3A to 3F.

As described above in detail, according to example embodiments, after an alignment key having a step height difference with respect to a substrate is formed in a scribe line, and before an element-forming pattern is formed in a chip region, a capping layer for capping the alignment key may be formed. Therefore, the fabrication may be simplified because additional mask-forming processes may be not necessary, and the capping layer may protect the alignment key during a subsequent wet etch process, maintaining a constant step height difference of the alignment key, which may improve alignment.

The foregoing is illustrative of example embodiments and is not to be construed as limiting thereof. While example embodiments have been particularly shown and described with reference to the example embodiments shown in the drawings thereof, it will be understood by those of ordinary skill in the art that various changes in form and detail may be made therein without departing from the following claims.

What is claimed is:

1. A method of forming an alignment key of a semiconductor device, comprising:
    forming an isolation layer confining an active region in a chip region of a semiconductor substrate;
    forming an alignment key having a step height difference with respect to a surface of the semiconductor substrate in a scribe lane such that at least a portion of the alignment key protrudes from the surface of the semiconductor substrate and the alignment key substantially has the same step height as the isolation layer;
    forming an at least one formation layer; and
    transforming the at least one formation layer to form i) an element-forming pattern on the semiconductor substrate in the chip region, and ii) a capping layer capping the alignment key on the semiconductor substrate in the scribe lane,
    wherein the step height difference between the alignment key and the substrate of the semiconductor substrate is substantially equal to a step height difference between the surface of the substrate and the isolation layer.

2. The method of claim 1, wherein the at least one formation layer and the capping layer are composed of a material having an etch selectivity with respect to the alignment key.

3. The method of claim 1, wherein the alignment key includes an oxide layer, and the capping layer includes at least one formation layer, or a stack layer, further including at least one formation layer.

4. The method of claim 1, wherein the at least one formation layer includes a material for forming a gate insulating layer or a gate electrode of the semiconductor device.

5. The method of claim 4, wherein the gate electrode includes a gate oxide layer or a gate insulating layer.

6. The method of claim 1, wherein the at least one formation layer includes a material for forming a capacitor lower electrode of the semiconductor device.

7. The method of claim 1, wherein the at least one formation layer includes a material for forming a capacitor dielectric layer of the semiconductor device.

8. The method of claim 1, wherein the at least one formation layer includes a stack structure, further including a material for forming a capacitor lower electrode of the semiconductor device and a material for forming a capacitor dielectric layer of the semiconductor device.

9. The method of claim 1, wherein the forming of the isolation layer and the alignment key includes:
    forming a pad oxide layer and a hard mask layer on the substrate such that portions where the isolation layer and the alignment key are formed on the substrate are exposed;
    etching the exposed portions of the substrate to form a first trench in the chip region and a second trench in the scribe lane;
    forming the isolation layer in the first trench; and
    forming the alignment key in the second trench.

10. The method of claim 9, wherein the hard mask layer has a thickness of about 500 Å to about 3000 Å.

11. The method of claim 1, wherein the step height difference of the alignment key is about 50 Å to about 2000 Å.

12. The method of claim 1, wherein transforming the at least one formation layer includes patterning the at least one formation layer.

13. The method of claim 1, wherein transforming the at least one formation layer includes etching the at least one formation layer.

14. The method of claim 1, further comprising:
    forming a capacitor dielectric layer on a capacitor lower electrode; and
    forming a capacitor upper electrode on the capacitor dielectric layer.

15. The method of claim 1, further comprising: forming a capacitor upper electrode on a capacitor dielectric layer.

16. The method of claim 1, wherein at least one formation layer is at least one insulating layer.

17. The method of claim 16, wherein the at least one insulating layer is a nitride layer.

18. The method of claim 1, wherein the at least one formation layer is a conductive layer.

19. The method of claim 18, wherein the conductive layer is a polysilicon layer.

20. A method of forming an alignment key of a semiconductor device, comprising:
    forming an isolation layer confining an active region in a chip region of a semiconductor substrate;

forming an alignment key on at least one trench of the semiconductor substrate, the alignment key having a step height difference with respect to a surface of the semiconductor substrate in a scribe lane such that at least a portion of the alignment key protrudes from the surface of the semiconductor substrate;

forming an at least one formation layer; and transforming the at least one formation layer to form i) an element-forming pattern on the semiconductor substrate m the chip region, and ii) a capping layer capping the alignment key on the semiconductor substrate in the scribe lane, wherein the step height difference between the alignment key and the substrate of the semiconductor substrate being substantially equal to a step height difference between the surface of the substrate and the isolation layer.

* * * * *